United States Patent
Zhong et al.

(10) Patent No.: US 12,046,460 B1
(45) Date of Patent: Jul. 23, 2024

(54) PROGRAMMABLE ELECTROSTATIC CHUCK TO ENHANCE ALUMINUM FILM MORPHOLOGY

(71) Applicant: Applied Materials, Inc., Santa Clara, CA (US)

(72) Inventors: Yaoying Zhong, Singapore (SG); Siew Kit Hoi, Singapore (SG); Bridger Earl Hoerner, Columbia Falls, MT (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 18 days.

(21) Appl. No.: 18/093,138

(22) Filed: Jan. 4, 2023

(51) Int. Cl.
| | |
|---|---|
| *C23C 14/54* | (2006.01) |
| *C23C 14/14* | (2006.01) |
| *C23C 14/34* | (2006.01) |
| *C23C 14/50* | (2006.01) |
| *H01J 37/32* | (2006.01) |

(52) U.S. Cl.
CPC ........ *H01J 37/32724* (2013.01); *C23C 14/14* (2013.01); *C23C 14/34* (2013.01); *C23C 14/50* (2013.01); *C23C 14/54* (2013.01); *C23C 14/541* (2013.01); *H01J 2237/002* (2013.01); *H01J 2237/2007* (2013.01); *H01J 2237/24585* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 10,257,887 B2 | 4/2019 | Matyushkin et al. | |
| 2001/0025783 A1 | 10/2001 | Sundarrajan et al. | |
| 2002/0127852 A1 | 9/2002 | Kawakami et al. | |
| 2006/0027169 A1* | 2/2006 | Tsukamoto | C23C 16/46 118/724 |
| 2007/0227877 A1 | 10/2007 | Wang | |
| 2008/0241778 A1 | 10/2008 | Kulp | |
| 2013/0171744 A1 | 7/2013 | Kang et al. | |
| 2015/0371847 A1* | 12/2015 | Cheng | C23C 14/0641 204/192.25 |
| 2018/0374724 A1 | 12/2018 | Parkhe et al. | |

(Continued)

FOREIGN PATENT DOCUMENTS

WO  WO 2020/094520 A1  5/2020

OTHER PUBLICATIONS

PCT International Search Report and Written Opinion for PCT/US2023/035878 dated Feb. 20, 2024.

(Continued)

*Primary Examiner* — Jason Berman
(74) *Attorney, Agent, or Firm* — Moser Taboa

(57) ABSTRACT

Methods, systems, and apparatus for controlling substrate temperature include: monitoring a temperature in each zone of a plurality of zones of a substrate support, the substrate support having a support surface for supporting a substrate, wherein the support surface is opposed to a sputtering target for depositing material onto the substrate; depositing material from the sputtering target on the substrate; and independently controlling fluid flowing in a plurality of separate fluid channels in the substrate support, each fluid channel corresponding to one zone of the plurality of zones, wherein fluid flow is controlled based on a target life and the temperature in each zone.

14 Claims, 2 Drawing Sheets

(56) References Cited

U.S. PATENT DOCUMENTS

| | | |
|---|---|---|
| 2020/0385851 A1 | 12/2020 | Lerner et al. |
| 2021/0022212 A1 | 1/2021 | Cimino et al. |
| 2021/0132575 A1 | 5/2021 | Yamamoto et al. |
| 2022/0243332 A1 | 8/2022 | Chandrasekharan et al. |

OTHER PUBLICATIONS

PCT International Search Report and Written Opinion for PCT/US2023/035875 dated Feb. 20, 2024.

\* cited by examiner

PROGRAMMABLE ELECTROSTATIC CHUCK TO ENHANCE ALUMINUM FILM MORPHOLOGY

FIELD

Embodiments of the present disclosure generally relate to methods, systems, and apparatus for substrate temperature control.

BACKGROUND

AC bias is sometimes used during deposition of aluminum (Al) films (e.g., PVD deposition) on substrates. The AC bias is used to improve Al coverage on the substrate. However, the inventors have observed that AC bias can undesirably increase the temperature on substrates due to bombardment of certain portions of the substrate by argon radicals. The increased temperature can degrade the film morphology by increasing the roughness of the film surface, which can be measured as a reduction in reflective index (RI). Increased film roughness during Al deposition, may be exacerbated during downstream processing involving heat treatment, such as annealing.

Moreover, during Al deposition, outer edges of an electrostatic chuck may become contaminated. Such contamination may interfere with contact between the outer portion of the substrate and the surface of the electrostatic chuck, leading to reduced efficiency in heat transfer and higher temperatures around the outer portion of the substrate.

The inventors propose novel methods, systems, and apparatus for substrate temperature control.

SUMMARY

Methods, systems, and apparatus for controlling substrate temperature are provided herein. In some embodiments, a system for controlling substrate temperature includes: a process chamber; a substrate support disposed in the process chamber, the substrate support having a support surface configured to support a substrate, the substrate support having a plurality of zones; a sputtering target disposed in the process chamber opposite the support surface; a plurality of temperature sensors, at least one temperature sensor configured to sense temperature in corresponding zones of the plurality of zones; a plurality of separate fluid channels, each fluid channel corresponding to one zone of the plurality of zones; and a controller configured to independently control fluid flowing in each fluid channel based on a target life and the temperature in each zone.

In some embodiments, a method for controlling substrate temperature includes: monitoring a temperature in each zone of a plurality of zones of a substrate support, the substrate support having a support surface for supporting a substrate, wherein the support surface is opposed to a sputtering target for depositing material onto the substrate; depositing material from the sputtering target on the substrate; and independently controlling fluid flowing in a plurality of separate fluid channels in the substrate support, each fluid channel corresponding to one zone of the plurality of zones, wherein fluid flow is controlled based on a target life and the temperature in each zone.

In some embodiments, a non-transitory computer readable storage medium having instructions stored thereon that, when executed, perform a method for controlling substrate temperature, the method comprising: monitoring a temperature in each zone of a plurality of zones of a substrate support, the substrate support having a support surface for supporting a substrate, wherein the support surface is opposed to a sputtering target for depositing material onto the substrate; depositing material from the sputtering target on the substrate; and independently controlling fluid flowing in a plurality of separate fluid channels in the substrate support, each fluid channel corresponding to one zone of the plurality of zones, wherein fluid flow is controlled based on a target life and the temperature in each zone.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
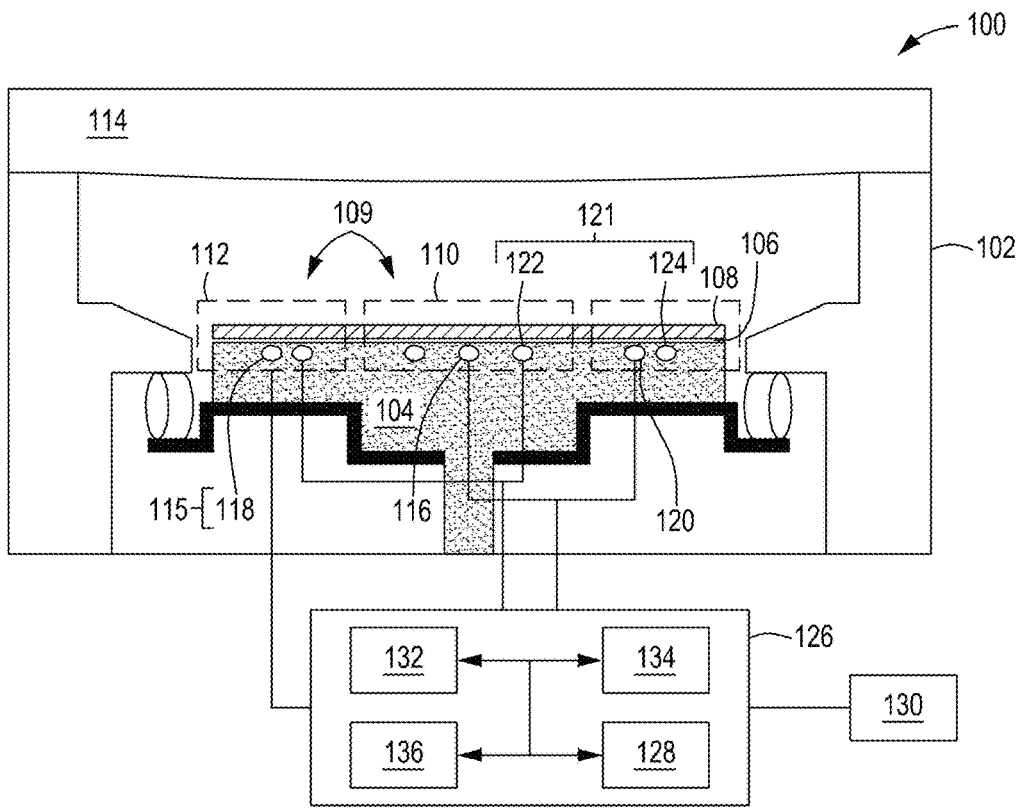
FIG. 1 is a schematic view of a system in accordance with embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods, systems, and apparatus for controlling substrate temperature are provided herein. Such methods, systems, and apparatus can provide independent control to a plurality of separate fluid channels corresponding to zones of a substrate support taking into account temperature in each zone as well as the life of a sputtering target. By taking into account both temperature in each zone as well as the life of the sputtering target, the effects of AC bias induced surface degradation and electrostatic chuck contamination can both be reduced, while also avoiding manual temperature adjustments, preventive maintenance, and downtime.

FIG. 1 is a schematic view of a system 100 in accordance with embodiments of the present disclosure. In some embodiments the system 100 may include a process chamber 102 and a substrate support 104 disposed in the process chamber 102. In some embodiments, the process chamber is a PVD chamber. The substrate support 104 may have a support surface 106 to support a substrate 108. The substrate support 104 may have a plurality of zones 109 (a first zone 110 near a center of the substrate support 104, and a second zone 112 near an edge of the substrate support 104 are shown in FIG. 1). In some embodiments, the substrate support 104 is circular and the plurality of zones include at least one of a circular zone or an annular zone. The system 100 may also include a sputtering target 114 disposed in the process chamber 102 opposite the support surface 106 and the substrate 108. In some embodiments, the sputtering target 114 may include aluminum. The system 100 may also include a plurality of temperature sensors 115 (a first temperature sensor 116, a second temperature sensor 118, and a third temperature sensor 120 are shown in FIG. 1), each of which is configured to sense temperature in a corresponding zone. For example, in FIG. 1, the first temperature sensor 116 is configured to sense temperature in the first zone 110, and the second temperature sensor 118 and the third temperature sensor 120 are configured to sense temperature in the second zone 112. In some embodiments, the temperature in each zone may be monitored by one corresponding temperature sensor located in each zone. The system 100 may also include a plurality of separate fluid channels 121 (a first fluid channel 122 and a second fluid channel 124 are shown in FIG. 1), each of which corresponds to a zone of the plurality of zones 109. For example, in the embodiment shown in FIG. 1, the first fluid channel 122 corresponds to the first zone 110 and the second fluid channel 124 corresponds to the second zone 112.

In some embodiments, the plurality of fluid channels 121 may contain a heat transfer fluid, such as water. In some embodiments, and as shown in FIG. 1, the plurality of zones 109 may be arranged as circles or annular regions of the substrate support 104 and the plurality of fluid channels 121 may be arranged to extend concentrically in one or more zones of the plurality of zones 109.

In some embodiments, and as shown in FIG. 1, the system 100 may include a controller 126 configured to independently control fluid flowing in each fluid channel based on a target life of the sputtering target 114 and the temperature(s) in each zone of the plurality of zones 109. In some embodiments, the controller 126 includes at least one flow controller 128 connected to the plurality of separate fluid channels 121 and to a fluid supply 130, and the flow controller 128 may be configured to control fluid flow rate through each fluid channel of the plurality of fluid channels 121.

In some embodiments, the controller 126 is configured to automatically set a ratio of flow rates between the fluid channels of the plurality of fluid channels 121 based on the target life and the temperature in each zone of the plurality of zones 109. The target life is the amount of elapsed time the sputtering target 114 is used for deposition processing, which may be monitored and recorded. In some embodiments, the controller 126 may store a predetermined lookup table of ratios of flow rates for various spans of target life. In some embodiments, the controller 126 may determine a ratio of flow rates using other methods, such as by calculating the ratio using a functional relationship between flow rate ratio and target life.

In some embodiments, the controller 126 may be configured to determine, for each respective fluid channel of the plurality of fluid channels 121, a zone temperature profile at a beginning of target life and at a later time, and to adjust flow rate to each fluid channel of the plurality of fluid channels 121 at the later time based on the target life and a difference between the zone temperature profile at the beginning of target life and at the later time.

In some embodiments, the controller 126 may include a processor 132 (programmable) that is operable with a memory 134 and a mass storage device, an input control unit, and a display unit (not shown), such as power supplies, clocks, cache, input/output (I/O) circuits, the flow controller 128, and support circuits 136 coupled to the various components of the processing system to facilitate control of the substrate processing. Support circuits 136 may be coupled to the processor 132 for supporting the processor 132 in a conventional manner.

To facilitate control of the system 100 described above, the processor 132 may be one of any form of general-purpose computer processor that can be used in an industrial setting, such as a programmable logic controller (PLC), for controlling various chambers and sub-processors. The memory 134 coupled to the processor 132 and the memory 134 can be non-transitory computer readable storage medium and may be one or more of readily available memory such as random access memory (RAM), read only memory (ROM), floppy disk drive, hard disk, or any other form of digital storage, local or remote. Charged species generation, heating, deposition, and other processes are generally stored in the memory 134, typically as software routine. The software routine may also be stored and/or executed by a second processor (not shown) that is remotely located from the system 100 being controlled by the processor 132.

The memory 134 may be in the form of computer-readable storage media that contains instructions, which when executed by the processor 132, facilitates the operation of the system 100. The instructions in the memory 134 may be in the form of a program product such as a program that implements the method in accordance with embodiments of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative non-transitory computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such non-transitory computer-readable storage media, when carrying computer-readable instructions that direct the functions of the methods described herein, are embodiments of the present disclosure.

Figure 2:
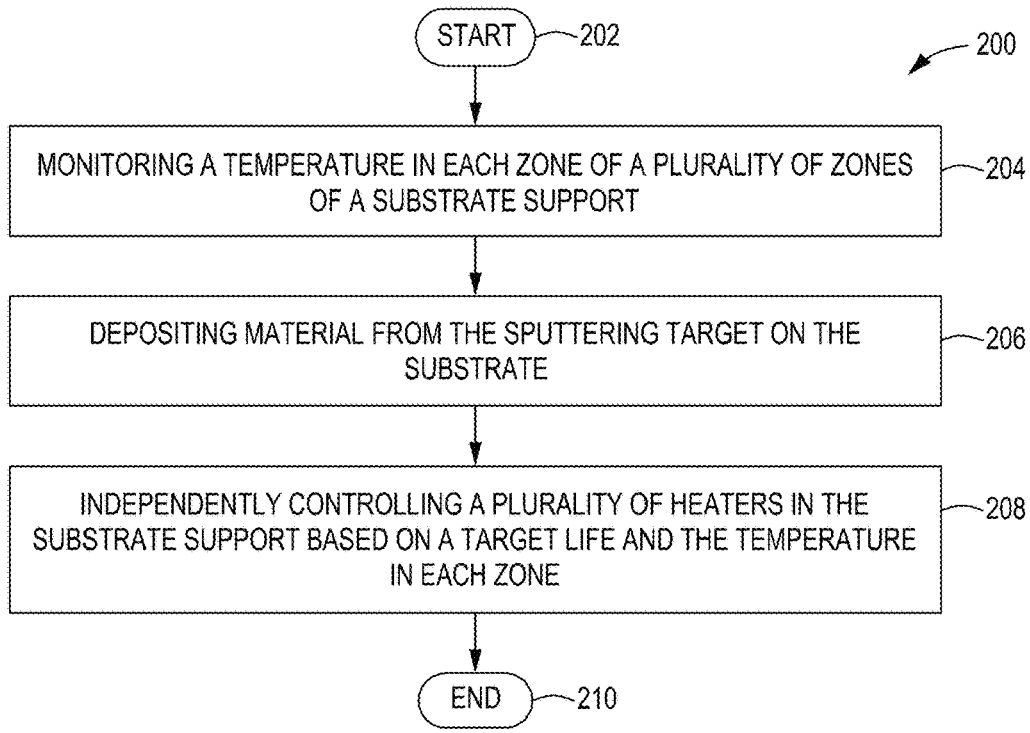
FIG. 2 shows a method for controlling substrate temperature in accordance with embodiments of the present disclosure.

FIG. 2 shows a method 200 for controlling substrate temperature in accordance with embodiments of the present disclosure. At the start of the method 200 at 202, the 108 substrate may be placed on the support surface 106 of the substrate support 104. At 204, temperature(s) in each zone of the plurality of zones 109 of the substrate support 104 are monitored using the plurality of temperature sensors 115. At 206, material (e.g., Al) from the sputtering target 114 is deposited on the substrate 108 in a deposition process (e.g., PVD) while the temperature(s) in each zone of the plurality of zones 109 are being monitored. At 208, fluid flow in each fluid channel of the plurality of fluid channels 121 in the substrate support 104 are independently controlled based on the target life and the temperature in each zone of the plurality of zones 109. The fluid flow in each fluid channel of the plurality of fluid channels 121 are controlled to achieve desired temperatures in the plurality of zones 109. At 210, the deposition process may end.

In some embodiments, controlling fluid flow in the plurality of fluid channels 121 includes controlling flow rate to each fluid channel, such as by use of the at least one flow controller 128 as discussed above. In some embodiments, controlling fluid flow in the plurality of fluid channels 121 includes automatically setting a ratio of flow rates between the fluid channels of the plurality of fluid channels 121 based upon the target life and the temperature in each zone.

As described above, in some embodiments, a ratio of flow rates between fluid channels of the plurality of fluid channels 121 may be set using a predetermined lookup table of ratios of flow rates for various target lifetimes or by calculating a ratio using a functional relationship between flow rate ratio and target life. For example, for the embodiment shown in FIG. 1, at the beginning of target life, the controller 126 may set the ratio of flow rates between the first fluid channel 122 and the second fluid channel 124 to be 1:1; i.e., the flow rate in the second fluid channel 124 is set at 100% of the flow rate in the first fluid channel 122. At a later time after the beginning of the target life, if the temperature in either the first zone 110 or the second zone 112 is outside a predetermined limit, or if the temperature difference between the first zone 110 or the second zone 112 exceeds a predetermined limit, the controller 126 may set the ratio of flow rates between the first fluid channel 122 and the second fluid channel 124 based on the target life at the later time. Adjustments of the ratio of flow rates may be useful to compensate for variations in temperature and heat transfer efficiency in the plurality of zones 109 during deposition processing.

Figure 3:
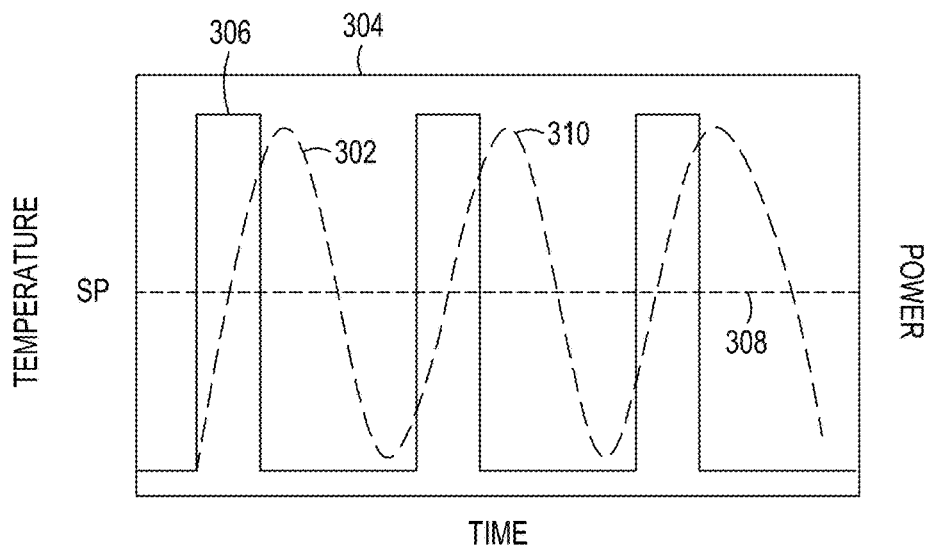
FIG. 3 is a graph showing a temperature profile in one zone of a substrate support at the beginning of life of a sputtering target in accordance with embodiments of the present disclosure.
Figure 4:
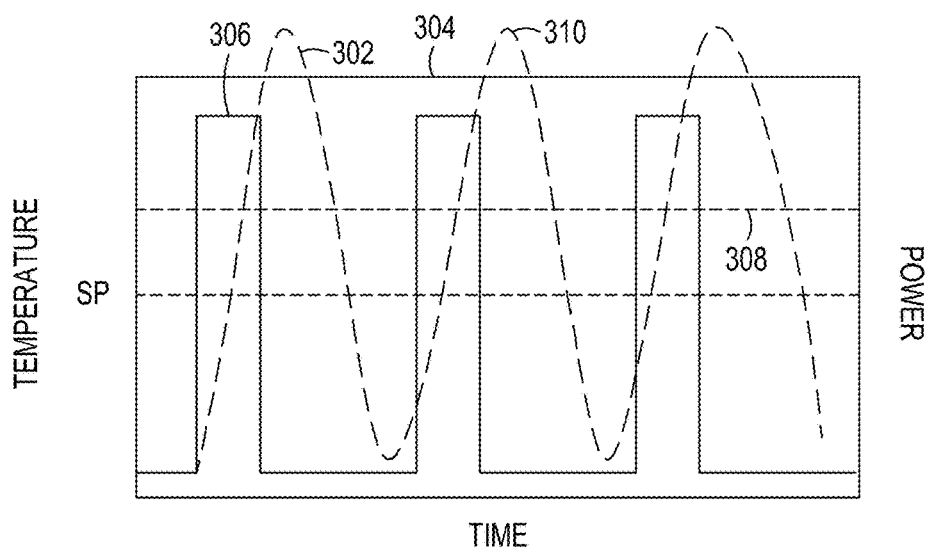
FIG. 4 is a graph showing a temperature profile in one zone of a substrate support at a later time in the life of the sputtering target in accordance with embodiments of the present disclosure.

In some embodiments, controlling fluid flow in each fluid channel of the plurality of fluid channels 121 may include determining, for each respective fluid channel, a zone temperature profile at a beginning of target life and at a later time, and adjusting flow rate in each fluid channel at the later time based on a difference between the zone temperature profile at the beginning of target life and at the later time and the target life. For example, FIG. 3 is a graph showing a zone temperature profile of the second zone 112 as monitored by the second temperature sensor 118 while the second zone 112 is heated and cooled by fluid flow in the second fluid channel 124 during three heating and cooling cycles at the beginning of life of the sputtering target 114. As shown in FIG. 3, the temperature 302 remains below an upper limit 304. FIG. 3 also shows the flow rate 306 in the second fluid channel 124 at the beginning of life of the sputtering target 114. FIG. 4 is a graph showing a zone temperature profile of the second zone 112 as monitored by the second temperature sensor 118 during three heating and cooling cycles at a later time in the life of the sputtering target 114. As shown in FIG. 4, the temperature 302 exceeds the upper limit 304 while the fluid flow rate 306 in second fluid channel 124 is the same flow rate 306 as at the beginning of the target life.

In the examples shown in FIGS. 3 and 4, the temperature setpoint SP for the second zone 112 is the same and, thus, the controller 126 is controlling the fluid flow in the second fluid channel 124 to achieve an average temperature in the second zone 112 equal to the setpoint. In FIG. 3, the average temperature 308 is at or near the setpoint. In FIG. 4, the average temperature 308 is above the setpoint, which indicates that the controller 126 is not controlling as effectively at the later time and that tuning the flow rate in the second fluid channel 124 may be useful.

In some embodiments, if the temperature in a zone of the plurality of zones 109 exceeds a limit by a certain amount or the average temperature deviates from the setpoint by a certain amount, the controller 126 may adjust the flow rate in the fluid channel corresponding to the respective zone based upon the target life and the flow rate to the fluid channel at the beginning of target life and a difference between the temperature profiles at the beginning of target life and at the later time. For example, if the maximum temperature 310 in FIG. 4 exceeds the upper limit 304 by a certain amount, such as 3° C., or if the average temperature 308 at the later time exceeds the average temperature 308 at the beginning of target life shown in FIG. 3 by a certain amount, the controller 126 may adjust (e.g., reduce) flow rate in the second fluid channel 124 based upon the flow rate to the fluid channel at the beginning of target life and a difference between the temperature profiles at the beginning of target life and at the later time. For example, the difference between the temperature profiles may be determined to be a difference between maximum temperatures 310 at the beginning of target life and at the later time. Also, for example, the difference between the temperature profiles may be a difference between the average temperatures 308 at the beginning of target life and at the later time.

In some embodiments, to account for reduced heat transfer efficiency caused by accumulation of contamination on the substrate support 104 from the sputtering target 114, the controller 126 may track the target life and determine an effective heat transfer efficiency of each zone of the plurality of zones 109 at the later time. In some embodiments, the controller 126 may use the difference in temperature profiles and the effective heat transfer efficiency to determine a compensation factor, which can be applied to the flow rate 306 at the beginning of target life (e.g., as shown in FIG. 3) to calculate an adjusted flow rate in the fluid channel at the later time. The compensation factor may be expressed as a percentage of the flow rate in a fluid channel at the beginning of target life.

Figure 5:
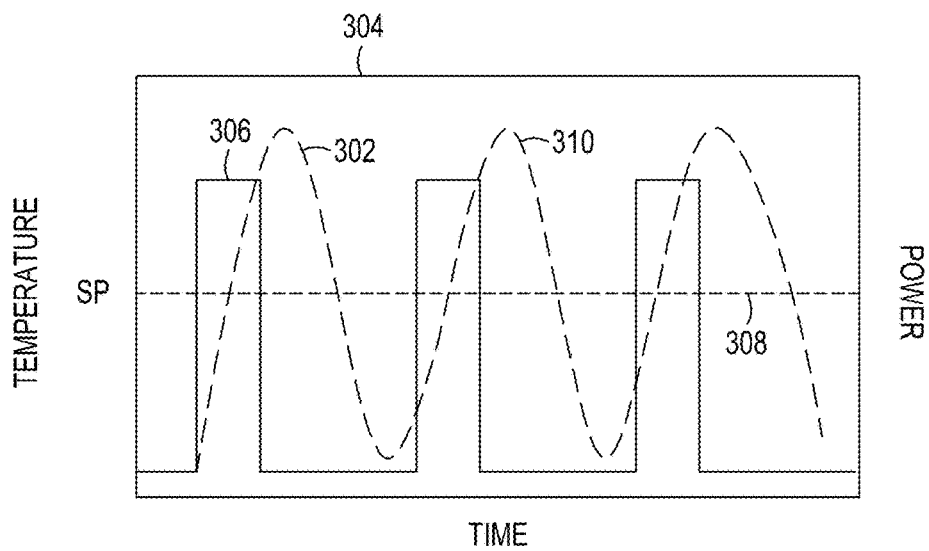
FIG. 5 is a graph showing a temperature profile in one zone of a substrate support after adjustment of fluid flow rate in a fluid channel in one zone of a substrate support in accordance with embodiments of the present disclosure.

FIG. 5 is a graph showing a zone temperature profile of the second zone 112 as monitored by the second temperature sensor 118 during three heating and cooling cycles at a time after that in FIG. 4. FIG. 5 shows the result after adjustment of flow rate to the second fluid channel 124 as described above. As shown in FIG. 5, the flow rate 306 to the second fluid channel 124 is reduced in comparison to the flow rate 306 to the second fluid channel 124 at the beginning of target life shown in FIG. 3, and the maximum temperatures 310 shown in FIG. 5 remain below the upper limit 304. Thus, the controller 126 can automatically be tuned over the target life. As a result, AC bias induced surface roughness degradation can be controlled and mitigated.

While the foregoing is directed to embodiments of the present disclosure, other and further embodiments of the disclosure may be devised without departing from the basic scope thereof.

The invention claimed is:

1. A system for controlling substrate temperature, comprising:
   a process chamber;
   a substrate support disposed in the process chamber, the substrate support having a support surface configured to support a substrate, the substrate support having a plurality of zones;
   a plurality of temperature sensors, at least one temperature sensor configured to sense a temperature in corresponding zones of the plurality of zones;

a plurality of separate fluid channels, each fluid channel corresponding to one zone of the plurality of zones; and a controller configured to independently control fluid flowing in each fluid channel based on a target life of a sputtering target and the temperature in each zone, wherein the controller includes at least one flow controller connected to the plurality of separate fluid channels, the flow controller configured to control fluid flow rate through each fluid channel, and wherein the controller is configured to automatically set a predetermined ratio of flow rates between the plurality of separate fluid channels based on the target life and the temperature in each zone.

2. The system of claim 1, wherein the controller is configured to determine, for each respective fluid channel, a zone temperature profile at a beginning of target life and at a later time, and to adjust fluid flow rate in each fluid channel at the later time based on a difference between the zone temperature profile at the beginning of target life and at the later time.

3. The system of claim 1, wherein each temperature sensor is located in a corresponding zone.

4. The system of claim 1, wherein the substrate support is circular and the plurality of zones include at least one of circular or annular zones.

5. A method for controlling substrate temperature, comprising:

monitoring a temperature in each zone of a plurality of zones of a substrate support, the substrate support having a support surface for supporting a substrate, wherein the support surface is opposed to a sputtering target for depositing material onto the substrate;

depositing material from the sputtering target on the substrate; and independently controlling fluid flowing in a plurality of separate fluid channels in the substrate support, each fluid channel corresponding to one zone of the plurality of zones, wherein fluid flow is controlled based on a target life and the temperature in each zone, wherein controlling fluid flowing in each fluid channel includes controlling a flow rate of the fluid in each fluid channel, and wherein controlling the flow rate of the fluid in each fluid channel includes automatically setting a predetermined ratio of flow rates between the plurality of separate fluid channels based upon the target life and the temperature in each zone.

6. The method of claim 5, wherein controlling the flow rate of the fluid in each fluid channel includes determining, for each respective fluid channel, a zone temperature profile at a beginning of target life and at a later time, and adjusting the flow rate in each fluid channel at the later time based on a difference between the zone temperature profile at the beginning of target life and at the later time.

7. The method of claim 6, wherein the flow rate in the respective fluid channel is adjusted if a difference between an average temperature of the zone temperature profile at a beginning of target life and an average temperature of the zone temperature profile at the later time exceeds a predetermined amount.

8. The method of claim 5, wherein the temperature in each zone is monitored by a corresponding temperature sensor located in each zone.

9. The method of claim 5, wherein the plurality of zones include at least one of circular or annular zones.

10. A non-transitory computer readable storage medium having instructions stored thereon that, when executed, perform a method for controlling substrate temperature, the method comprising:

monitoring a temperature in each zone of a plurality of zones of a substrate support, the substrate support having a support surface for supporting a substrate, wherein the support surface is opposed to a sputtering target for depositing material onto the substrate;

depositing material from the sputtering target on the substrate; and independently controlling fluid flowing in a plurality of separate fluid channels in the substrate support, each fluid channel corresponding to one zone of the plurality of zones, wherein fluid flow is controlled based on a target life and the temperature in each zone, wherein controlling fluid flowing in each fluid channel includes controlling a flow rate of fluid in each channel, and wherein controlling the flow rate of fluid in each fluid channel includes automatically setting a predetermined ratio of flow rates between the plurality of separate fluid channels based upon the target life and the temperature in each zone.

11. The non-transitory computer readable storage medium of claim 10, wherein controlling the flow rate of fluid in each fluid channel includes determining, for each respective fluid channel, a zone temperature profile at a beginning of target life and at a later time, and adjusting the flow rate of fluid in each fluid channel at the later time based on a difference between the zone temperature profile at the beginning of target life and at the later time.

12. The non-transitory computer readable storage medium of claim 11, wherein the flow rate of fluid in the respective fluid channel is adjusted if a difference between an average temperature of the zone temperature profile at a beginning of target life and an average temperature of the zone temperature profile at the later time exceeds a predetermined amount.

13. The non-transitory computer readable storage medium of claim 10, wherein the temperature in each zone is monitored by a corresponding temperature sensor located in each zone.

14. The non-transitory computer readable storage medium of claim 10, wherein the plurality of zones include at least one of circular or annular zones.

* * * * *